United States Patent
Smith et al.

(10) Patent No.: US 9,638,322 B2
(45) Date of Patent: May 2, 2017

(54) PISTON RING WITH DUAL COATING

(71) Applicant: Mahle International GmbH, Stuttgart (DE)

(72) Inventors: Thomas Smith, Muskegon, MI (US); Jason Bieneman, Brunswick, MI (US)

(73) Assignee: Mahle International GmbH (DE)

( * ) Notice: Subject to any disclaimer, the term of this patent is extended or adjusted under 35 U.S.C. 154(b) by 267 days.

(21) Appl. No.: 14/143,698

(22) Filed: Dec. 30, 2013

(65) Prior Publication Data

US 2014/0217677 A1  Aug. 7, 2014

Related U.S. Application Data

(60) Provisional application No. 61/747,780, filed on Dec. 31, 2012.

(51) Int. Cl.
| | |
|---|---|
| *B23P 15/06* | (2006.01) |
| *F16J 9/26* | (2006.01) |
| *C23C 4/06* | (2016.01) |
| *C23C 4/18* | (2006.01) |
| *C23C 14/02* | (2006.01) |
| *C23C 14/06* | (2006.01) |

(52) U.S. Cl.
CPC ..... *F16J 9/26* (2013.01); *C23C 4/06* (2013.01); *C23C 4/18* (2013.01); *C23C 14/025* (2013.01); *C23C 14/028* (2013.01); *C23C 14/0641* (2013.01)

(58) Field of Classification Search
CPC ....... F16J 9/26; F16J 9/20; F16J 9/206; B23P 15/06; C23C 14/0641
See application file for complete search history.

(56) References Cited

U.S. PATENT DOCUMENTS 3,615,099 A * 10/1971 Prasse .............. F16J 9/26
  277/444
3,671,047 A *  6/1972 Umezawa .......... B23P 15/08
  277/444

(Continued)

FOREIGN PATENT DOCUMENTS

DE         19621721 A1   12/1996
DE      102004032403 B3   12/2005
(Continued)

OTHER PUBLICATIONS

English Abstract for DE19621721.

(Continued)

*Primary Examiner* — Kristina Fulton
*Assistant Examiner* — Eugene G Byrd
(74) *Attorney, Agent, or Firm* — Fishman Stewart PLLC

(57) ABSTRACT

Exemplary piston rings are disclosed, comprising a base portion formed of a metallic material, and an outer contact surface extending between opposing side faces of the piston ring. The piston ring may include a coating layer applied to the outer contact surface, with the coating layer including an inner layer and an outer layer. Exemplary methods of making a piston ring are also disclosed, comprising providing a base portion formed of a metallic material, applying an inner layer to an outer surface of the base portion, and applying an outer layer on top of the inner layer.

20 Claims, 6 Drawing Sheets

(56) References Cited

U.S. PATENT DOCUMENTS

| | | | | |
|---|---|---|---|---|
| 3,723,259 A * | 3/1973 | Umezawa | F16J 9/26 | 205/122 |
| 4,106,782 A * | 8/1978 | Hyde | C23C 4/11 | 277/444 |
| 4,323,257 A * | 4/1982 | Kondo | B23P 15/08 | 277/441 |
| 5,316,321 A * | 5/1994 | Ishida | F16J 9/26 | 277/443 |
| 5,605,741 A | 2/1997 | Hite et al. | | |
| 5,660,399 A * | 8/1997 | Atmur | F16J 9/28 | 277/357 |
| 5,713,129 A * | 2/1998 | Rastegar | C23C 4/12 | 29/527.4 |
| 6,161,837 A | 12/2000 | Shureb | | |
| 6,562,480 B1 * | 5/2003 | Stong | C23C 4/06 | 29/888.074 |
| 2002/0117808 A1 * | 8/2002 | Ogawa | C23C 8/26 | 277/443 |
| 2007/0210524 A1 * | 9/2007 | Herbst-Dederichs | F16J 9/26 | 277/310 |
| 2008/0007006 A1 * | 1/2008 | Kawai | C23C 14/024 | 277/310 |
| 2009/0174150 A1 * | 7/2009 | Smith | C23C 4/005 | 277/442 |
| 2010/0001474 A1 * | 1/2010 | Araujo | C23C 8/28 | 277/443 |
| 2010/0044967 A1 * | 2/2010 | Esser | F16J 9/26 | 277/442 |
| 2010/0066031 A1 * | 3/2010 | Esser | F16J 9/26 | 277/444 |
| 2010/0127462 A1 * | 5/2010 | Buchmann | C23C 4/02 | 277/444 |
| 2011/0254230 A1 * | 10/2011 | Jarosinski | C22C 27/06 | 277/444 |
| 2012/0205876 A1 * | 8/2012 | Fujimura | F16J 9/20 | 277/442 |
| 2013/0075977 A1 | 3/2013 | An | | |
| 2013/0214493 A1 | 8/2013 | Cha et al. | | |
| 2014/0008874 A1 * | 1/2014 | Esser | C23C 8/04 | 277/443 |
| 2015/0252901 A1 * | 9/2015 | Kennedy | C23C 4/06 | 277/444 |

FOREIGN PATENT DOCUMENTS

| | | |
|---|---|---|
| DE | 102004032342 A1 | 2/2006 |
| DE | 102012005174 A1 | 10/2012 |
| EP | 0764801 A1 | 3/1997 |
| EP | 1876345 A1 | 1/2008 |
| EP | 2413006 A1 | 2/2012 |
| WO | WO-2011012336 A1 | 2/2011 |

OTHER PUBLICATIONS

English Abstract for DE102004032403.
English Abstract for EP0764801.
English Abstract for WO2011012336.
English Abstract for DE102004032342.
English Abstract for DE102012005174.
International Search Report for PCT/US2013/078289, dated May 15, 2014, 5 pages.

* cited by examiner

PISTON RING WITH DUAL COATING

CROSS-REFERENCE TO RELATED APPLICATIONS

This application claims priority to U.S. Provisional Patent Application No. 61/747,780 filed Dec. 31, 2012, the contents of which is hereby incorporated in its entirety.

BACKGROUND

Outer surfaces of piston rings are often coated to improve performance characteristics of the rings, e.g., by altering frictional properties or wear characteristics of the surfaces. Some coatings, e.g., deposition coatings such as physical or chemical vapor deposition coatings, may generally improve break-in characteristics of the rings. However, deposition coatings may also suffer from disadvantages in wear life, and therefore rings employing such coatings may need to be replaced relatively more frequently. By contrast, other types of coatings that offer relatively better wear life and durability than deposition coatings may not break in as smoothly.

As such, piston ring manufacturers typically must generally accept certain disadvantages in performance depending upon which of the above coatings are selected. Moreover, efforts to limit the above disadvantages by combining coatings have been unsuccessful. For example, it has been difficult to obtain an adequate bond strength between different coatings, resulting in cracks, chips, or other failures in the applied coatings.

Accordingly, there is a need for an improved piston ring that addresses the inherent disadvantages of certain coating types, while allowing for a commercially practical method of application in a mass manufacturing environment.

BRIEF DESCRIPTION OF THE DRAWINGS

While the claims are not limited to the illustrated examples, an appreciation of various aspects is best gained through a discussion of various examples thereof. Referring now to the drawings, exemplary illustrations are shown in detail. Although the drawings represent the various examples, the drawings are not necessarily to scale and certain features may be exaggerated to better illustrate and explain an innovative aspect of an example. Further, the examples described herein are not intended to be exhaustive or otherwise limiting or restricting to the precise form and configuration shown in the drawings and disclosed in the following detailed description. Exemplary illustrations are described in detail by referring to the drawings as follows.

DESCRIPTION

Figure 1A:
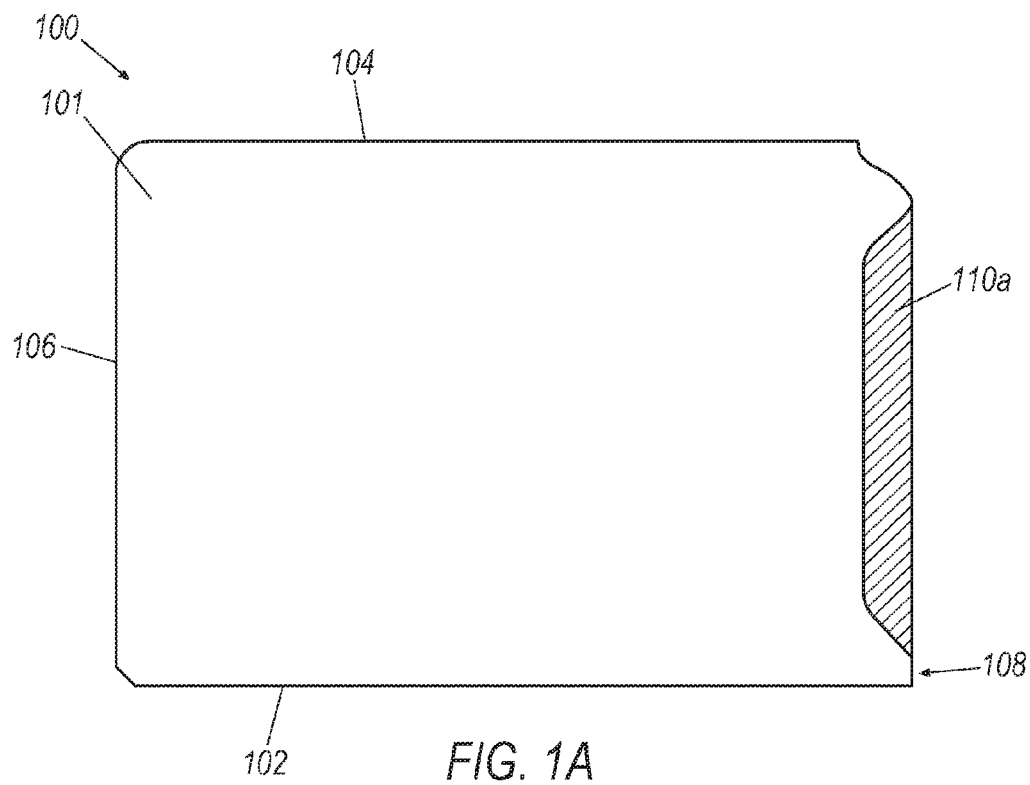
FIG. 1A illustrates a cross-sectional view of an exemplary piston ring prior to application of an outer coating layer, e.g., a PVD layer.

Exemplary illustrations are provided herein of a piston ring comprising a base portion formed of a metallic material, and an outer contact surface extending between opposing side faces of the piston ring. Exemplary piston rings may include a coating layer applied to the outer contact surface, with the coating layer including an inner layer and an outer layer.

Exemplary illustrations are also directed to methods of making a piston ring. In one exemplary approach, a method includes providing a base portion formed of a metallic material, applying an inner layer to an outer surface of the base portion, and applying an outer layer on top of the inner layer.

Referring now to FIGS. 1A-1D, various cross-sectional views of a piston ring are shown, according to an exemplary illustration. The exemplary piston ring 100 may be formed of a base metallic material 101, e.g., steel. Exemplary piston rings may be employed in an outer circumferential groove of a piston (not shown). The piston may be received within an engine block (not shown) defining an inner bore surface or cylinder liner surface.

As shown, the piston ring may have a lower surface 102, an upper surface 104, and an inner surface 106. A radially outermost surface 108 of the ring may include an exemplary coating comprising an inner layer 110a and an outer layer 110b (collectively, coating 110). The upper surface 104 and inner surface 106 are each shown without a coating, while the lower surface 102 includes a wear coating 112. Moreover, any one or more of the upper, lower, and inner surfaces may be coated with any coating that is convenient.

Figure 1B:
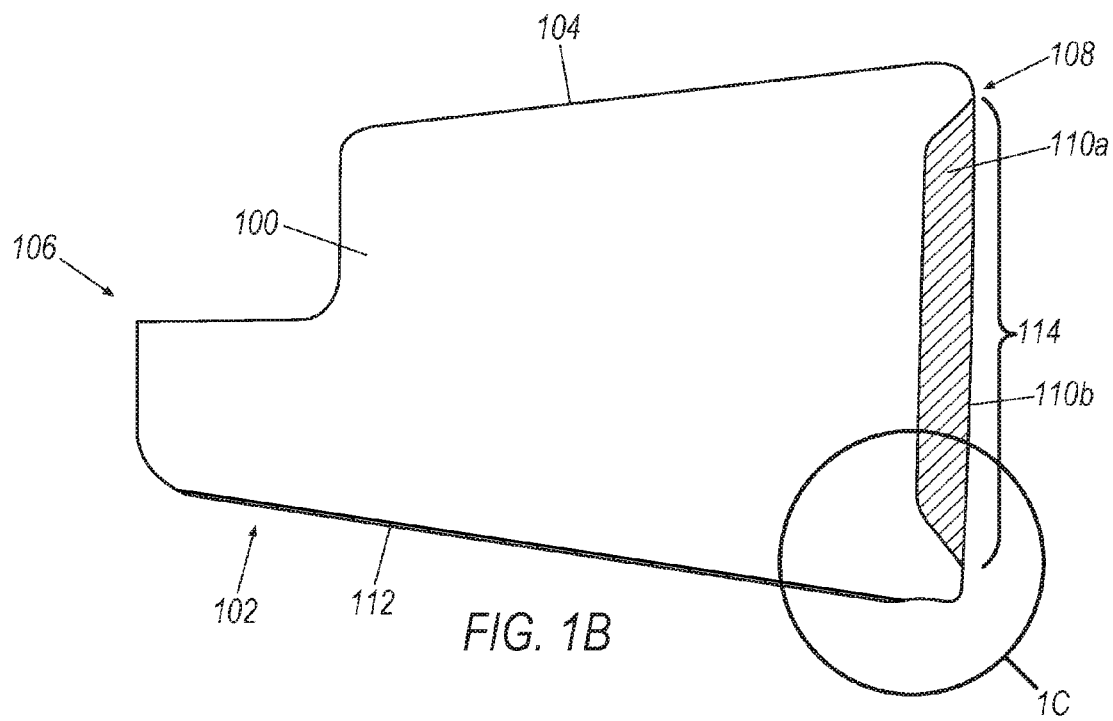
FIG. 1B illustrates a cross-sectional view of an exemplary piston ring after application of an outer coating layer, e.g., a PVD layer.
Figure 1C:
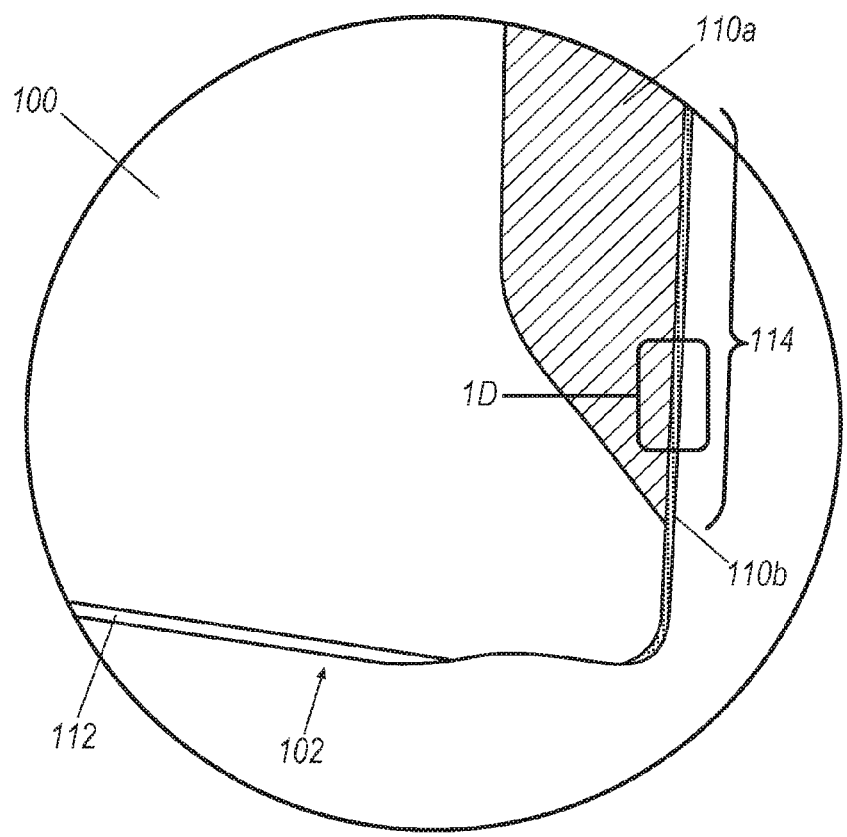
FIG. 1C illustrates an enlarged cross-sectional view of an exemplary finished piston ring having an inner layer and an outer coating layer over the inner layer, according to one exemplary illustration.
Figure 1D:
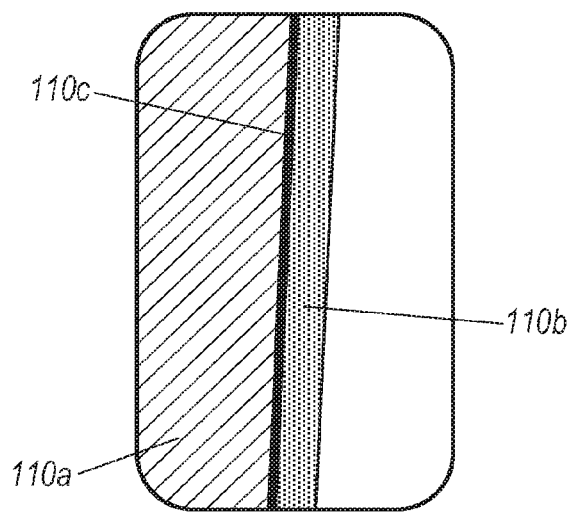
FIG. 1D illustrates an enlarged portion of FIG. 1C, illustrating a relative thickness of the outer layer to the inner layer and an intermediate layer.

As best seen in FIGS. 1C and 1D, exemplary two-layer or duplex coatings 110 on the outer surface may include two distinct layers 110a, 110b. More specifically, an inner layer 110a or coating may be formed as a relatively high-density, non-porous coating 110a. In one example, the inner coating 110a is a thermally sprayed coating, e.g., applied in a high velocity oxy-fuel (HVOF) process. Additionally, as best seen in FIGS. 1B and 1C, the inner coating 110a may be inlaid in the outer surface 108. More specifically, the inner coating 110a may be applied in an inset region 114 of the outer surface 108.

An outer layer 110b of coating may also be applied over the inner coating 110a, for example as shown in FIGS. 1C and 1D. In one exemplary approach, the outer coating 110b is a deposition coating, e.g., physical vapor deposition (PVD) or chemical vapor deposition (CVD), or a diamond-like carbon (DLC) coating. In another exemplary illustration, a relatively thin outer layer 110b of a vapor deposition coating, e.g., a PVD coating of approximately 10-15 µm, is applied over a relatively thicker inner layer 110a, e.g., 100-150 µm of a HVOF material. In another exemplary illustration, an outer layer 110b may comprise a thickness of approximately 5-40 µm, while the inner layer 110a may comprise a thickness of approximately 25-300 µm.

Generally, the PVD coating provides excellent break-in properties and scuff resistance. Once the PVD coating wears through, the inner layer provides excellent wear life. In this example, the provision of a relatively thin outer vapor deposition layer of 10 µm over an inner HVOF layer may result in approximately double the wear life of a single, relatively thicker (e.g., 30 µm) vapor deposition layer without an inner HVOF layer.

As best seen in FIG. 1D, a relatively thin intermediate layer 110c may be present between the outer layer 110b and inner layer 110a. In one exemplary illustration, the intermediate layer is approximately one-tenth the thickness of the outer layer 110b. In another example, the intermediate layer 110c is approximately 1.4 µm thick while the outer layer 110b is approximately 14.5 µm thick. The intermediate layer 110c may result from application of a chrome-nitride PVD layer over the top of the inner layer 110a. More specifically, the intermediate layer 110c may be a chrome-based layer 110c that is generated during the PVD application process of an exemplary chrome-nitride material, resulting in a generally pure chrome layer 110c between an outer PVD layer, e.g., outer layer 110b, and an inner HVOF layer, e.g., layer 110a.

In some exemplary illustrations, a break or gap between rings may be used to prevent bridging of coating as it is applied to rings that are stacked on top of each other. For example, as best seen in FIG. 2B, a gap 200 may be provided along a top circumferentially outer edge 116 of the piston rings 100, e.g., by chamfering the upper outer corner. By contrast, as shown the lower corner 118 of the outer diameter surface may remain relatively sharp, thereby increasing a scraping ability of the lower corner 118, e.g., and improving a capability of the rings 100 at scraping oil from an associated engine bore surface (not shown). In one exemplary illustration, a break 200 is put in the ring 100a at the upper corner 116 of the ring 100a, e.g., by chamfering, immediately prior to application of the outer layer 110b, e.g., a PVD outer layer 110b (not shown in FIGS. 2A and 2B).

Alternatively, the lower corner 118 may be chamfered, e.g., to further increase the break between the outer surfaces 108 of the stacked rings 100a, 100b. In this manner, consistent with some previous approaches a break may thereby be provided on both the top outside corner 116 and bottom outside corner 118 of the rings.

Figure 2A:
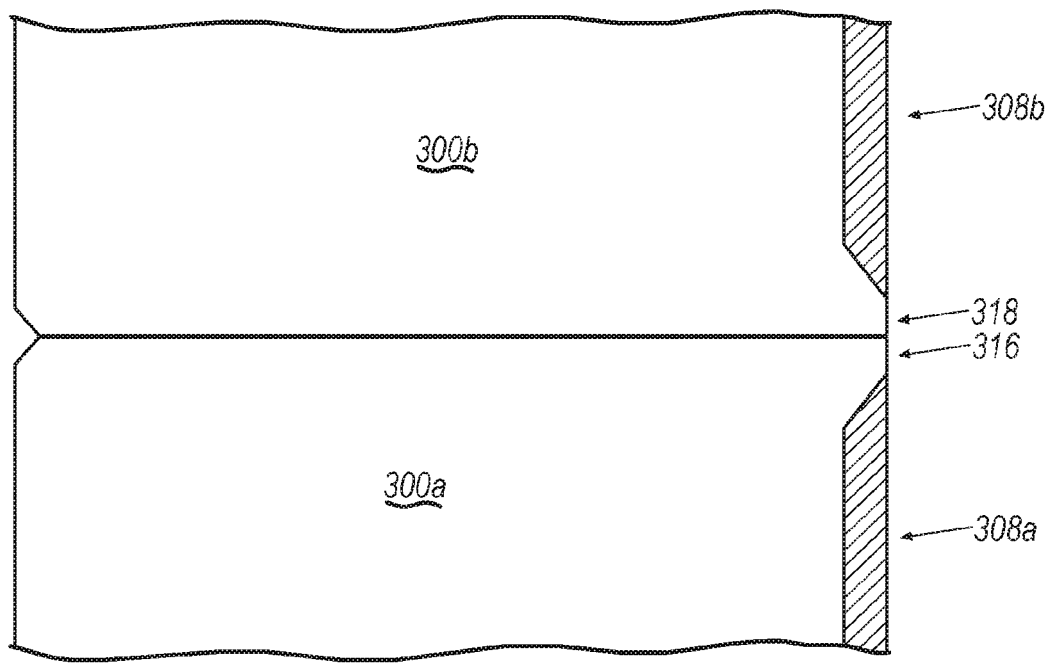
FIG. 2A illustrates a cross-sectional view of a pair of prior art piston rings stacked together without a gap provided between the rings.
Figure 2B:
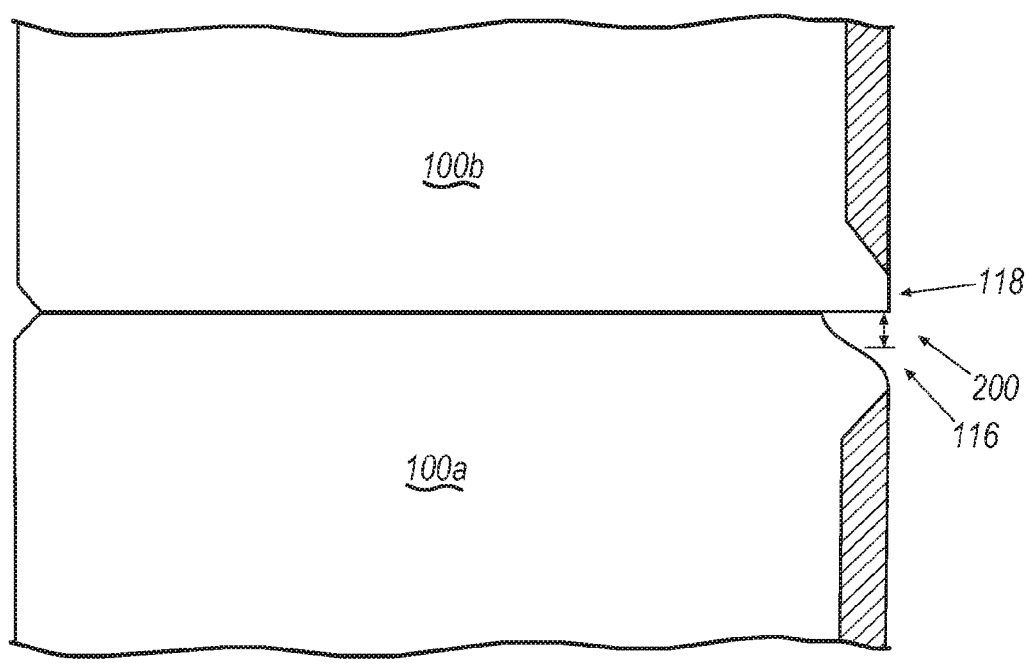
FIG. 2B illustrates a cross-sectional view of a pair of exemplary piston rings stacked together with a gap provided between the rings to prevent an applied coating from bridging between the adjacent rings.
Figure 3A:
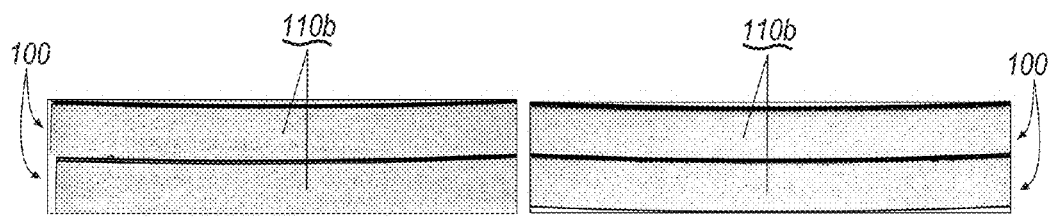
FIG. 3A illustrates the outer surfaces, i.e., outer coating layers, of four exemplary finished piston rings prior to an engine testing procedure.
Figure 3B:
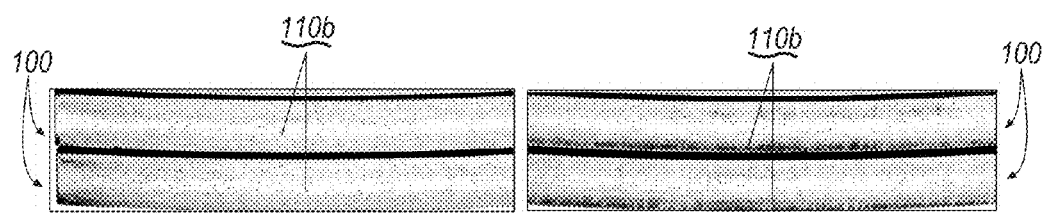
FIG. 3B illustrates the outer surfaces, i.e., outer coating layers, of the four exemplary finished piston rings from FIG. 3A after an engine testing procedure.
Figure 4A:
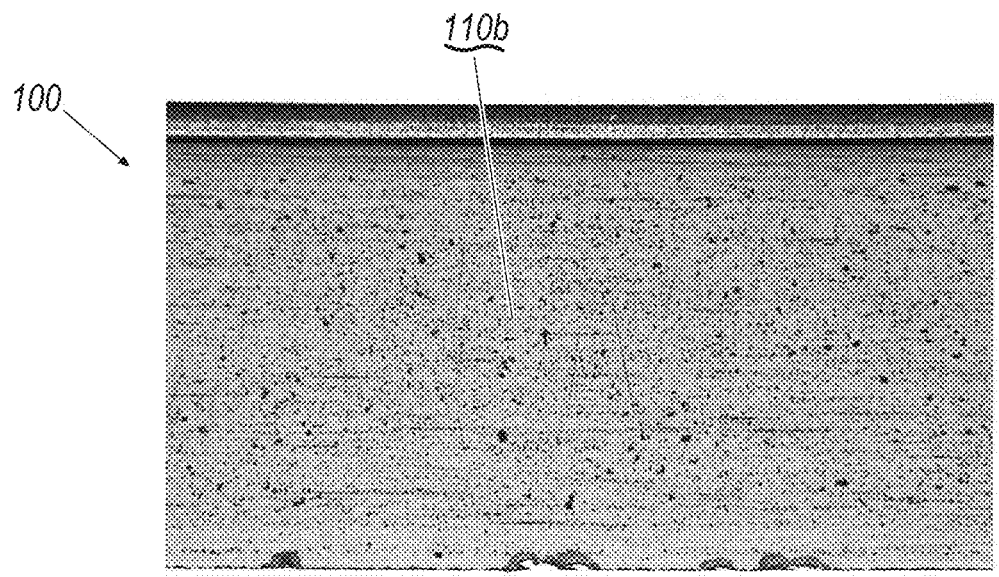
FIG. 4A illustrates an enlarged view of the outer surface, i.e., outer coating layer, of an exemplary finished piston ring prior to an engine testing procedure.
Figure 4B:
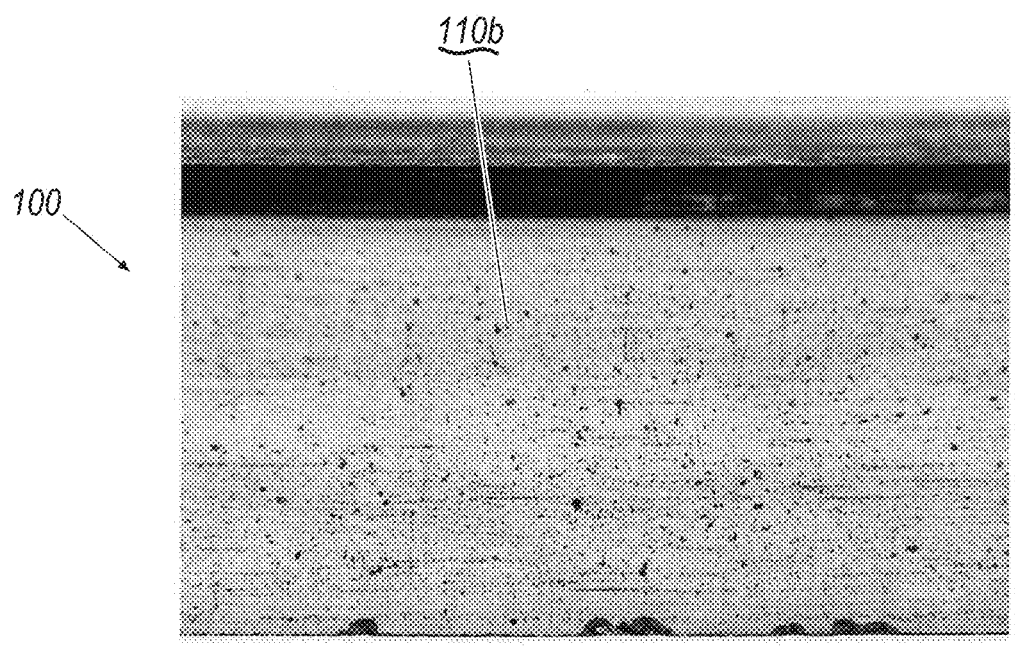
FIG. 4B illustrates an enlarged view of the outer surface, i.e., outer coating layer, of the exemplary finished piston ring from FIG. 4A after an engine testing procedure.

In contrast to providing a break along the outside surface of the exemplary piston rings 100, e.g., as shown in FIG. 2B, one previous approach illustrated in FIG. 2A did not provide such a break, which would lead to a greater likelihood of an applied coating (not shown in FIG. 2A) bridging between the adjacent rings 300a, 300b. In other words, the adjacent corners 316, 318 of the ring 300a, 300b, respectively, may be inadvertently joined by a coating layer extending continuously between the outer surfaces 308a, 308b of the rings 300a, 300b, respectively.

As best seen in FIGS. 3A, 3B, 4A, and 4B, engine testing of the exemplary rings 100 demonstrated a lack of microcracks or other failures in the outer layers 110b of the exemplary rings 100. More specifically, as shown the outer surfaces of the outer layers 110b illustrated in FIG. 3B (and in FIG. 4B, which is an enlarged view) are relatively undamaged in comparison to the outer surfaces of the outer layers 110b shown prior to the testing in FIG. 3A (and in FIG. 4A, which is an enlarged view). Moreover, contact patterns were consistent and there were no signs of micro cracks along the outer layers 110b. This success stands in contrast to previous approaches, which generally resulted in adhesion issues of outer PVD layers to an inner layer, or cracks in the outer PVD layer.

As noted above, exemplary inner coatings 110a may include thermally sprayed or HVOF coatings, merely as examples. A thermal spray coating may be applied directly to the outer surface 108 of the piston ring 100. In some instances the outer surface 108 of the piston ring 100 may be roughened prior to the application of the thermal spray coating. A bonding layer may also need to be applied to the outer surface 108 of the piston ring 100 prior to the application of the thermal spray coating.

Exemplary thermal spray coatings may be comprised of any suitable type of alloy, multiphase alloys, and/or combinations thereof. Examples of such materials include, but are not limited to, copper alloys, iron alloys, nickel alloys, cobalt alloys, molybdenum alloys, tin alloys, and aluminum alloys. Exemplary thermal spray coatings may be applied such that the coating has a suitable thickness based on engine type and/or the piston type. As noted above, in one exemplary approach, a thermal spray coating used for inner layer 110a may have a thickness in the range of about 100-150 microns.

The thermal spray coating may be applied using the following thermal spray application methods, merely as examples: HVOF, arc spray, and/or flame spray. The material(s) selected to form a desired thermal spray coating 110a may be introduced into the spray device such that the material(s) melt or partially melt. Thus, when the material(s) contacts the radially outer surface of the piston ring, a thermal spray coating is formed. Due to thermal spray application, the use of high performance materials is possible.

Generally, a thermal spray coating may be applied to the outer surface 108 of the piston ring using a thermal spray torch (not shown). In some cases, it may be desirable to apply a bond coating (not shown) to the outer surface 108, and then apply the inner coating layer 110a thereafter. In other cases it may be desirable to apply the inner coating 110a directly to the outer surface 108 of the ring 100. Generally, a thermal spray procedure results in a coating 110a that is uniformly applied, i.e., that has a generally uniform thickness. Further, such uniform thicknesses of the inner layer 110a are generally possible even when applying coating material in a relatively thick layer 110a.

A wide range of possible wear coatings may be used for the inner coating layer 100a. Representative examples of possible wear coatings include, but are not limited to, the following:

Molybdenum Based
Nickel Based
Chrome Based
Tungsten Based
Iron Based
Cobalt Based
Copper Based
Carbides (including Chrome, Tungsten, Titanium, Vanadium, etc.)
Oxides (including Chrome, Aluminum, Titanium, etc.)
Nitrides (including Chrome, Aluminum, Titanium, etc.)

Further, representative examples of possible bond coatings may include, but are not limited to, the following:

Molybdenum Based
Nickel Based
Chrome Based
Tungsten Based
Iron Based
Cobalt Based
Copper Based Any other types of wear coatings may be employed that are convenient. Moreover, any other types of bond coatings may be employed that are convenient.

As noted above, rings 100 may generally be stacked to facilitate application of exemplary inner and outer coatings to multiple piston rings. Generally, a coating material may be applied using a fixture (not shown) that is spun about an axis of rotation which is defined by the ring 100. For example, a motor (not shown) may drive a spindle (not shown), such that the stack of rings 100a, 100b (see, e.g., FIG. 2B) turns about a central axis defined by the rings 100. A spray torch (not shown) may oscillate to provide a back and forth spraying motion to the piston rings 100a, 100b, thereby facilitating a relatively uniform thickness of the applied inner coating layer 110a.

Figure 5:
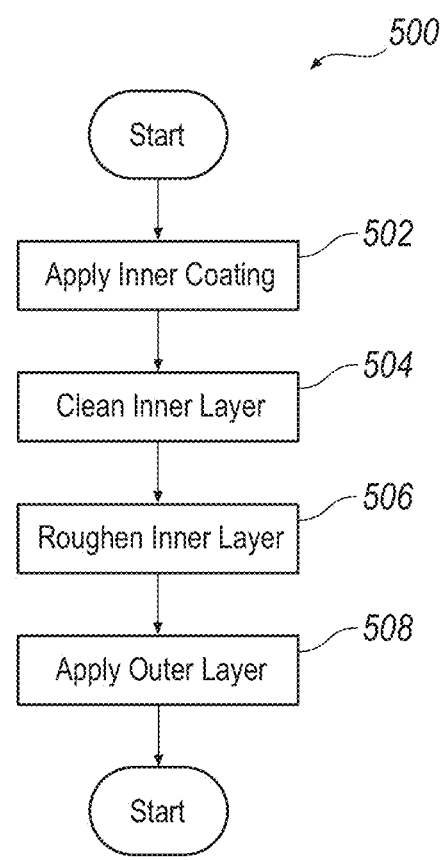
FIG. 5 illustrates a process flow diagram of an exemplary process for applying an inner and an outer coating layer to a piston ring.

Turning now FIG. 5, an exemplary process 500 for making an exemplary piston ring 100 having a two-layer coating 110 is illustrated. As noted above, the lack of micro-cracks and other failures in the outer layer 110b of the exemplary rings 100, produced in the exemplary process 500 below, is in contrast to previous efforts to combine coatings.

The exemplary process 500 may begin at block 502, where an inner coating is applied. For example, an inner coating 110a, as noted above, may be an HVOF applied coating 110a. Any coating may be employed that is convenient, although the inner coating 110a may be in some exemplary approaches relatively dense in comparison to the outer layer 110b, which has been found to be advantageous. By comparison, a plasma sprayed inner coating 110a may not provide adequate density of the inner layer 110a in some applications.

Additionally, the inner coating 110a may be generally non-porous, which has also been found to be advantageous. In one example, the inner layer 110a has a maximum porosity of 5%. In yet another example, the inner layer 110a has a maximum porosity of 1%. A porosity that is too large may result in detachments of the outer layer 110b, e.g., where the outer layer 110b is a PVD layer.

Proceeding to block 504, in some exemplary approaches the inner layer 110a may be cleaned, e.g., by a sonic cleaning process. The exemplary process may then proceed to block 506.

At block 506, the inner layer 110a may generally be roughened. In one exemplary illustration, a relatively light grit-blasting operation is employed. Exemplary roughening processes may generally activate the inner layer 110a, and may fracture oxide film formed on the inner layer 110a, e.g., in a HVOF application process. Time, pressure, and distance parameters associated with the grit-blasting process may be controlled to prevent erosion of the outermost surface of the inner layer 110a. Completion of the grit-blasting of the inner layer 110a may be evidenced by a generally matted appearance of the inner layer 110a. By contrast, the outermost surface of the inner layer 110a may be shiny upon initial application of the inner layer 110a to the piston ring 100. In one exemplary illustration, a grit-blasting process employs aluminum oxide ($Al_2O_3$) particles having a maximum size of approximately 180 microns (mm) at a pressure of approximately 5 bar, for three (3) minutes, at a distance of 120 millimeters. Moreover, in this exemplary illustration, the rings 100 may be placed upon a rotating fixture (not shown), which is rotated at a speed of approximately 100 rotations-per-minute (RPM) past an aperture from which the grit-blasted particles exit adjacent the rotating fixture to contact the rings 100, i.e., along the inner layer 110a.

Proceeding to block 508, an outer coating may be applied to the ring. For example, as described above an exemplary coating 110b may be applied on top of an inner layer 110a. Moreover, in one exemplary approach an outer layer 110b may be applied via a vapor deposition process, e.g., physical vapor deposition (PVD). The outer coating layer 110b may thus be distinct in structure and/or application in comparison to the inner layer 110a.

Accordingly, a dual-layer or duplex coating 110 comprising an inner layer 110a and an outer layer 110b may be applied effectively to a piston ring 100, avoiding previous problems of detachment, cracking, or other failures in a ring outer coating that is overlaid upon an inner coating. Exemplary rings 100 may thus have excellent break-in properties, such as are typically associated with a vapor deposition coating, while also having excellent long-term durability and wear characteristics as are typically associated with a thermally sprayed or HVOF coating. This may result in improved ring face durability as well as improved service life of associated pistons and engines.

The exemplary illustrations are not limited to the previously described examples. Rather, a plurality of variants and modifications are possible, which also make use of the ideas of the exemplary illustrations and therefore fall within the protective scope. Accordingly, it is to be understood that the above description is intended to be illustrative and not restrictive.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claimed invention.

Accordingly, it is to be understood that the above description is intended to be illustrative and not restrictive. Many embodiments and applications other than the examples provided would be upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

All terms used in the claims are intended to be given their broadest reasonable constructions and their ordinary meanings as understood by those skilled in the art unless an explicit indication to the contrary in made herein. In particular, use of the singular articles such as "a," "the," "the," etc. should be read to recite one or more of the indicated elements unless a claim recites an explicit limitation to the contrary.

What is claimed is:

1. A method of forming a piston ring, comprising: providing a base portion formed of a metallic material; applying a thermally sprayed inner layer to an outer surface of the base portion; dispersing an intermediate layer over the thermally sprayed inner layer, the intermediate layer composed of a chrome material: and applying a vapor deposition outer layer on top of the intermediate layer.

2. A method according to claim 1, wherein applying the thermally sprayed inner layer comprises a high-velocity oxy fuel spraying technique.

3. A method according to claim 2, wherein the high velocity oxy fuel sprayed inner layer comprises at least one of a chromium-based material and a nitrogen-based material.

4. A method according to claim 3, wherein the high velocity oxy fuel sprayed inner layer comprises a thickness between approximately 25 to 300 microns.

5. A method according to claim 1, wherein at least one of:
(i) the vapor deposition outer layer comprises at least one of a chromium-based material and a nitrogen-based material; and
(ii) the vapor deposition outer layer comprises a thickness of approximately 5 to 40 microns.

6. A method according to claim 1, further comprising performing a superficial roughening to an outer portion of the inner layer without eroding the outer portion of the inner layer, wherein performing the superficial roughening is prior to applying the intermediate layer.

7. A method according to claim 6, wherein performing the superficial roughening to the outer portion of the inner layer includes grit-blasting to facilitate fracturing oxide contaminants.

8. A method of forming a piston ring, comprising:
providing a base portion formed of a metallic material;
applying a high-velocity oxy fuel sprayed inner layer to an outer surface of the base portion;
performing a superficial roughening to an outer portion of the high-velocity oxy fuel sprayed inner layer to facilitate fracturing oxide contaminants;
dispersing an intermediate layer on the high-velocity oxy fuel sprayed inner layer, the intermediate layer composed of a chrome material;
applying a vapor deposition outer layer on top of the intermediate layer, wherein the outer portion of the inner layer is roughened prior to applying the intermediate layer; and
wherein applying the high-velocity oxy fuel sprayed inner layer forms a higher density coating compared to the vapor deposition outer layer.

9. A piston ring, comprising:
a base portion formed of a metallic material; an outer contact surface extending between opposing side faces of the piston ring; and a coating layer applied to the outer contact surface, the coating layer including an inner layer an outer layer, and an intermediate layer disposed between the inner layer and the outer layer; the inner layer including a high-velocity oxy fuel dispersed material; the outer layer including a vapor deposition material disposed on the inner intermediate layer; and the intermediate layer composed of a chrome material.

10. A piston ring according to claim 9, further comprising a metal-based bond layer disposed on the outer contact surface and underlaying the coating layer.

11. A piston ring according to claim 9, wherein at least one of (i) the high-velocity oxy fuel material of the inner layer comprises at least one of a chromium-based composition and a nitrogen-based composition and (ii) the vapor deposition material of the outer layer comprises at least one of a chromium-based composition and a nitrogen-based composition.

12. A piston ring according to claim 9, wherein the inner layer of the high-velocity oxy fuel dispersed material has a thickness of approximately 25 to 300 microns, and wherein the thickness of the inner layer is greater than that of the outer layer.

13. A piston ring according to claim 9, wherein the chrome material of the intermediate layer is a pure chrome material.

14. A piston ring according to claim 9, wherein the outer contact surface is disposed between an upper outer diameter corner and a lower outer diameter corner, and wherein one of the upper diameter corner and the lower diameter corner comprises a chamfer and the other of the upper diameter corner and the lower diameter corner comprises an edged corner.

15. A piston ring according to claim 10, wherein the inner layer has an outer surface including a matted texture.

16. A method according claim 1, wherein the chrome material of the intermediate layer is a pure chrome material.

17. A method according to claim 6, further comprising disposing a metal-based bond layer on the outer surface of the base portion before applying the thermally sprayed inner layer, wherein the metal-based bond layer is arranged between the outer surface of the base portion and the thermally sprayed inner layer.

18. A method according to claim 8, further comprising disposing a metal-based bond layer on the outer surface of the base portion before applying the high-velocity oxy fuel sprayed inner layer, wherein the metal-based bond layer is arranged between the outer surface of the base portion and the high-velocity oxy fuel sprayed inner layer.

19. A method according to claim 8, wherein performing the superficial roughening to the outer surface of the base portion includes grit-blasting without eroding an outermost portion of the outer surface.

20. A method according to claim 8, wherein the chrome material of the intermediate layer includes a pure chrome material.

* * * * *